(12) United States Patent
Sengoku et al.

(10) Patent No.: US 11,710,750 B2
(45) Date of Patent: Jul. 25, 2023

(54) SEMICONDUCTOR DEVICE

(71) Applicants: KABUSHIKI KAISHA TOSHIBA, Tokyo (JP); TOSHIBA ELECTRONIC DEVICES & STORAGE CORPORATION, Tokyo (JP)

(72) Inventors: Mitsuhiro Sengoku, Tokyo (JP); Nobu Matsumoto, Kanagawa (JP); Koichi Kokubun, Kanagawa (JP)

(73) Assignees: Kabushiki Kaisha Toshiba, Tokyo (JP); Toshiba Electronic Devices & Storage Corporation, Tokyo (JP)

( * ) Notice: Subject to any disclaimer, the term of this patent is extended or adjusted under 35 U.S.C. 154(b) by 132 days.

(21) Appl. No.: 17/458,121

(22) Filed: Aug. 26, 2021

(65) Prior Publication Data
US 2022/0302189 A1    Sep. 22, 2022

(30) Foreign Application Priority Data

Mar. 18, 2021 (JP) .................. 2021-044542

(51) Int. Cl.
*H01L 31/0352* (2006.01)
*H01L 27/146* (2006.01)

(52) U.S. Cl.
CPC .. *H01L 27/14607* (2013.01); *H01L 31/03529* (2013.01)

(58) Field of Classification Search
CPC ........... H01L 27/1446; H01L 27/14607; H01L 27/14609; H01L 27/1463; H01L 27/14649; H01L 31/035281; H01L 31/03529
See application file for complete search history.

(56) References Cited

U.S. PATENT DOCUMENTS

| 7,915,069 | B2 * | 3/2011 | Inoue | ................ H01L 27/14656 257/292 |
|---|---|---|---|---|
| 2004/0232494 | A1 * | 11/2004 | Nagano | ............. H01L 21/82385 257/E21.654 |
| 2007/0290238 | A1 * | 12/2007 | Adachi | .................. H04N 25/59 348/E3.018 |
| 2008/0211047 | A1 * | 9/2008 | Iida | ................... H01L 27/14609 257/E31.038 |
| 2009/0184317 | A1 * | 7/2009 | Sanfilippo | ......... H01L 27/14658 257/E31.116 |

(Continued)

FOREIGN PATENT DOCUMENTS

JP    2015084392 A    4/2015

*Primary Examiner* — Golam Mowla
(74) *Attorney, Agent, or Firm* — Kim & Stewart LLP

(57) ABSTRACT

A semiconductor device includes element regions which each include a first region of a first conductivity type, a second region of the first conductivity type on the first region and having a higher impurity concentration than that of the first region, a third region of a second conductivity type on the second region. The second region is between the first and third regions in a first direction. A first insulating portion surrounds each element region in a first plane. A fourth region of the first conductivity type surrounds each element region and the first insulating portion in the first plane. The fourth region has a higher impurity concentration than that of the first region. A quenching structure is above a part of the fourth region in the first direction and electrically connected to the third region.

20 Claims, 10 Drawing Sheets

(56) References Cited

U.S. PATENT DOCUMENTS

| | | | | |
|---|---|---|---|---|
| 2010/0148040 A1* | 6/2010 | Sanfilippo | ........... | H01L 31/1075 |
| | | | | 257/E31.063 |
| 2011/0241149 A1* | 10/2011 | Mazzillo | ............... | H01L 31/107 |
| | | | | 257/438 |
| 2012/0086079 A1* | 4/2012 | Kasai | ................ | H01L 27/14607 |
| | | | | 257/431 |
| 2019/0296074 A1 | 9/2019 | Kokubun et al. | | |

* cited by examiner

SEMICONDUCTOR DEVICE

CROSS-REFERENCE TO RELATED APPLICATION

This application is based upon and claims the benefit of priority from Japanese Patent Application No. 2021-044542, filed Mar. 18, 2021, the entire contents of which are incorporated herein by reference.

FIELD

Embodiments described herein relate generally to a semiconductor device for detecting light.

BACKGROUND

There are semiconductor devices that detect light. It is preferable that the light detection efficiency of these semiconductor device be high.

DETAILED DESCRIPTION

Figure 1:
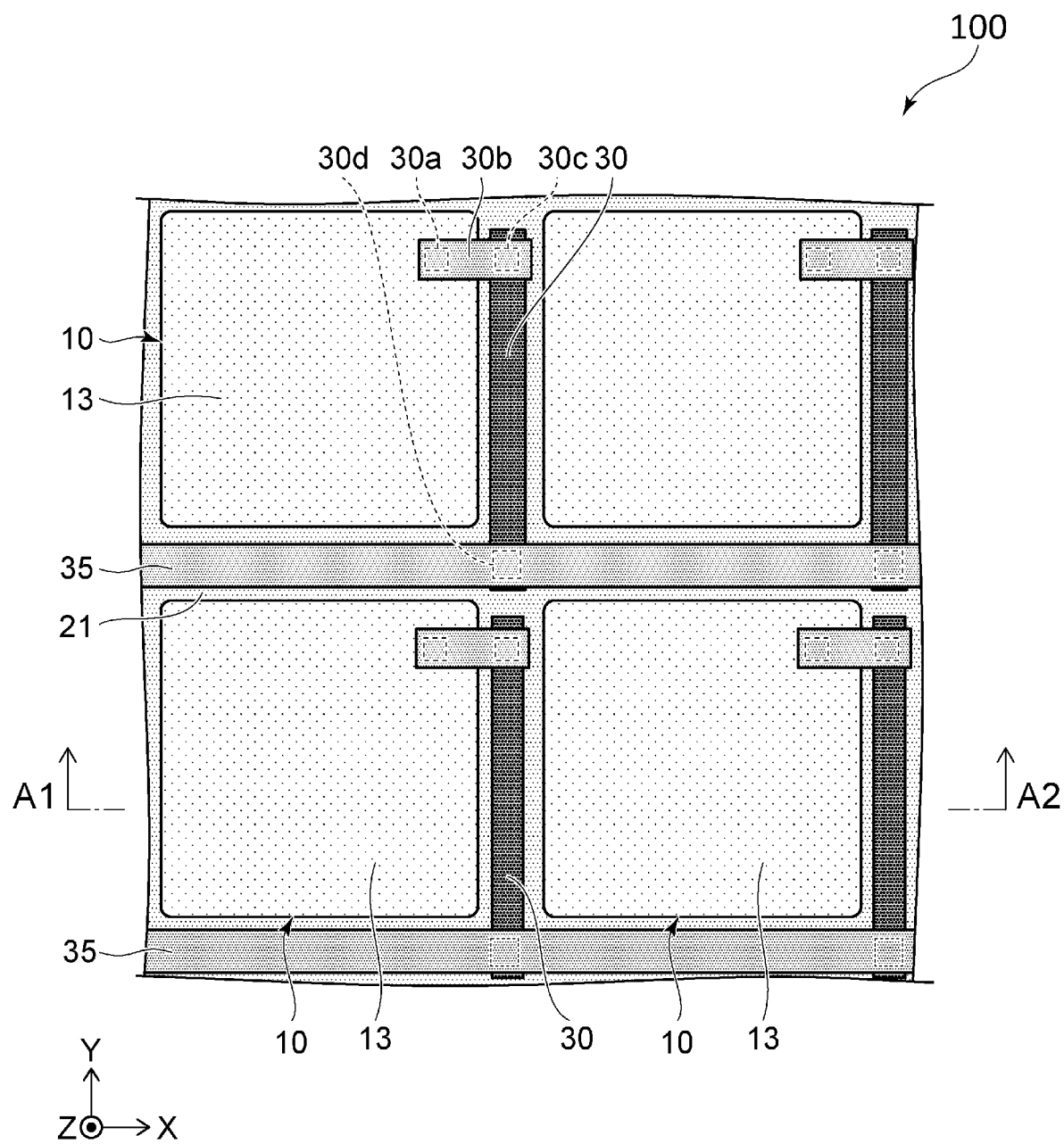
FIG. 1 is a schematic plan view illustrating a semiconductor device according to an embodiment.

Embodiments provide semiconductor devices capable of improving a light detection efficiency.

In general, according to one embodiment, a semiconductor device includes element portions, a first insulating portion, a fourth semiconductor region of a first conductivity type, and a quenching structure. The element regions each include a first semiconductor region of a first conductivity type, a second semiconductor region of the first conductivity type that is provided on the first semiconductor region and has a higher impurity concentration of the first conductivity type than that of the first semiconductor region, and a third semiconductor region of a second conductivity type that is provided on the second semiconductor region. The first insulating portion surrounds each the element region in a first plane intersecting a first direction. The fourth semiconductor region surrounds the first insulating portion in the first plane and has a higher impurity concentration of first conductivity type than that of the first semiconductor region. The quenching structure is electrically connected to the third semiconductor region.

Hereinafter, certain example embodiments of the present disclosure will be described with reference to the drawings.

The drawings are schematic or conceptual, and a relationship between the thickness and width of each portion, a ratio of sizes between the portion, or the like is not always the same as the actual one. Even when portions depicted in different drawings represent the same portion, dimensions and ratios of the portions may be represented differently depending on the drawing.

In this specification and each figure, the elements or aspects that are the same or substantially the same are denoted with the same reference numerals, and detailed description thereof will be omitted as appropriate from description of subsequent drawings and/or examples.

In the following description and drawings, the notations of $n^+$ and n, and $p^+$, p, and $p^-$ represent the relative levels of impurity concentrations. That is, the notation attached with "+" represents a higher impurity concentration than the notation attached without either "+" or "−", and the notation attached with "−" represents a lower impurity concentration than the notation attached without either "+" or "−". When each region contains both p-type impurities and n-type impurities, these notations represent the relative level of the net impurity concentration after the impurities of different types are compensated by each other.

In each of the embodiments described below, the p-type and the n-type of each semiconductor region may be inverted with one another to carry out each embodiment with the reverse semiconductor types from that specially described.

Figure 2:
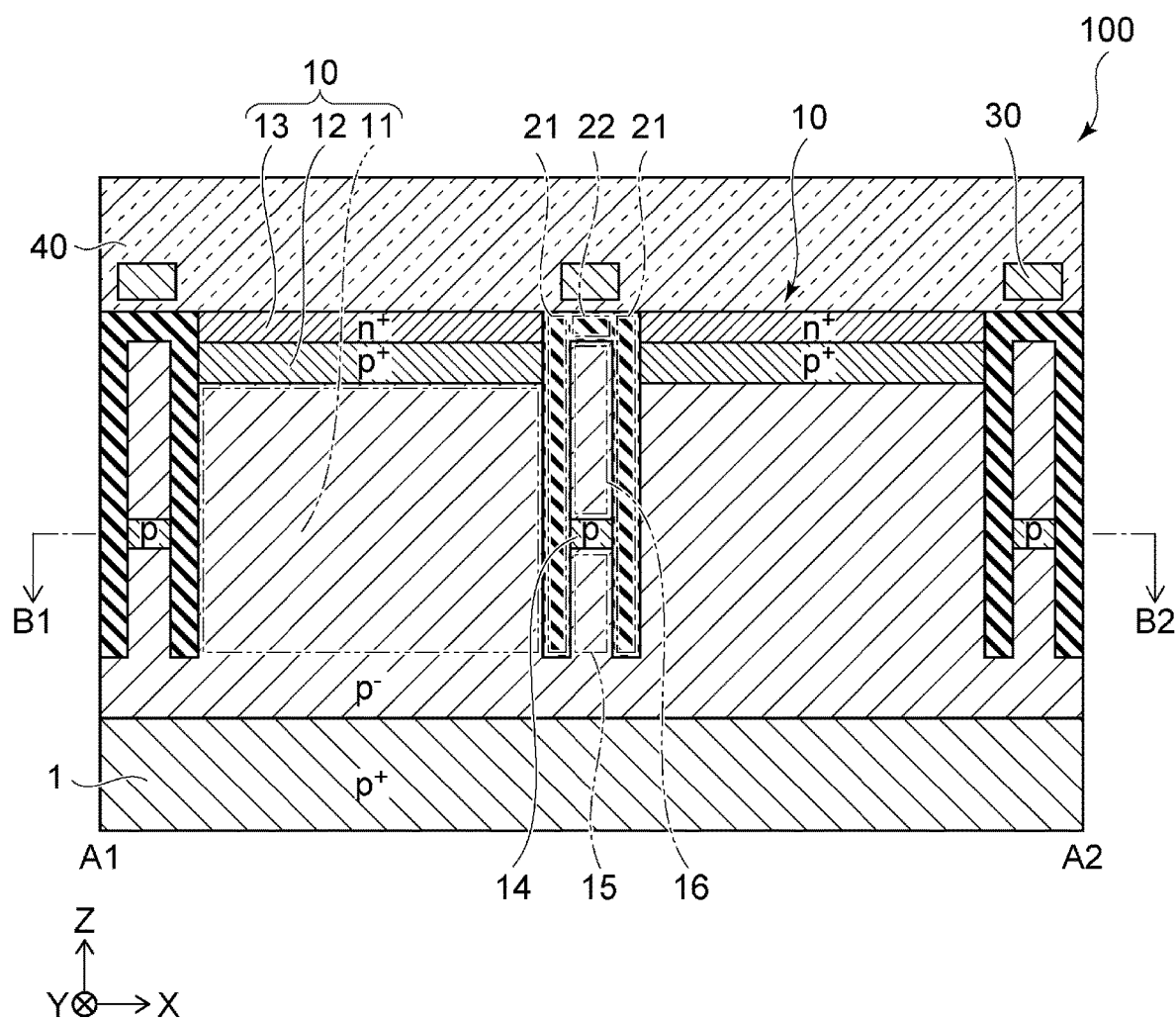
FIG. 2 is a cross-sectional view taken along line A1-A2 of FIG. 1.

FIG. 1 is a schematic plan view illustrating a semiconductor device according to an embodiment. FIG. 2 is a cross-sectional view taken along line A1-A2 of FIG. 1.

As illustrated in FIGS. 1 and 2, a semiconductor device 100 according to the first embodiment includes a $p^+$-type semiconductor layer 1, an element portion 10, a p-type semiconductor region 14 (fourth semiconductor region), a $p^-$-type semiconductor region 15 (fifth semiconductor region), a semiconductor region 16 (sixth semiconductor region), a first insulating portion 21, a second insulating portion 22, a quenching portion 30 (quenching structure), a wiring 35, and an insulating layer 40. In FIG. 1, the insulating layer 40 is omitted from the depiction for sake of clarity. In addition, a position of a contact plug is indicated by a broken line.

As illustrated in FIG. 2, an element portion 10 includes a $p^-$-type semiconductor region 11 (first semiconductor region), a $p^+$-type semiconductor region 12 (second semiconductor region), and an $n^+$-type semiconductor region 13 (third semiconductor region).

Herein, the direction from the $p^-$-type semiconductor region 11 to the $p^+$-type semiconductor region 12 is referred to as a Z direction (or first direction). A direction that intersects the Z direction is referred to as an X direction (or second direction). Another direction that intersects the X-Z plane is referred to as a Y direction (or third direction).

In the description, the direction from the $p^-$-type semiconductor region 11 towards the $p^+$-type semiconductor region 12 may be referred to as "upward" or the like, and the opposite direction is referred to as "downward" or the like. These directions are based on the relative positional relationship between the $p^-$-type semiconductor region 11 and the $p^+$-type semiconductor region 12 and are independent of the direction of gravity.

The $p^+$-type semiconductor layer 1 is provided on a lower surface of the semiconductor device 100. The $p^-$-type semiconductor region 11 of the element portion 10 is provided on the $p^+$-type semiconductor layer 1 and is electrically connected to the $p^+$-type semiconductor layer 1. The p-type impurity concentration in the p⁻-type semiconductor region 11 is lower than the p-type impurity concentration in the p⁺-type semiconductor layer 1.

The p⁺-type semiconductor region 12 is provided on the p⁻-type semiconductor region 11. The p-type impurity concentration in the p⁺-type semiconductor region 12 is higher than the p-type impurity concentration in the p⁻-type semiconductor region 11. A voltage is applied to the p⁺-type semiconductor region 12 via the p⁺-type semiconductor layer 1 and the p⁻-type semiconductor region 11.

The n⁺-type semiconductor region 13 is provided on the p⁺-type semiconductor region 12 and is in contact with the p⁺-type semiconductor region 12. A pn junction is formed between the p⁺-type semiconductor region 12 and the n⁺-type semiconductor region 13. For example, the pn junction surface extends along an X-Y plane perpendicular to the Z direction.

The first insulating portion 21 is provided surrounding the element portion 10 in the X-Y plane. For example, the first insulating portion 21 is in contact with the p⁻-type semiconductor region 11, the p⁺-type semiconductor region 12, and the n⁺-type semiconductor region 13. The lower end of the first insulating portion 21 is located below (at a greater depth than) the lower end of the p⁺-type semiconductor region 12. Preferably, the first insulating portion 21 extends to a depth below a depletion layer extending into the p⁻-type semiconductor region 11.

The p-type semiconductor region 14, the p⁻-type semiconductor region 15, and the semiconductor region 16 are provided surrounding the first insulating portion 21 in an X-Y plane. The p-type semiconductor region 14 is provided on the p⁻-type semiconductor region 15. The semiconductor region 16 is provided on the p-type semiconductor region 14. The p-type semiconductor region 14 is located at a greater depth than the p⁺-type semiconductor region 12. The semiconductor region 16 is located surrounding the p⁺-type semiconductor region 12 and the n⁺-type semiconductor region 13 along an X-Y plane.

The p-type impurity concentration in the p⁻-type semiconductor region 15 is lower than the p-type impurity concentration in the p-type semiconductor region 14. The semiconductor region 16 may be a p-type or an n-type. When the p-type impurity concentration in the semiconductor region 16 is lower than the p-type impurity concentration in the p-type semiconductor region 14, the conductivity type and impurity concentrations in the semiconductor region 16 may be freely selected. The p-type semiconductor region 14 and the p⁻-type semiconductor region 15 are electrically connected to the p⁺-type semiconductor layer 1.

As illustrated in FIGS. 1 and 2, a plurality of the element portions 10 are provided arrayed in the X direction and the Y direction. A plurality of first insulating portions 21 are provided surrounding each of these element portions 10 along an X-Y plane. A second insulating portion 22 is provided on each of the first insulating portions 21.

Figure 3:
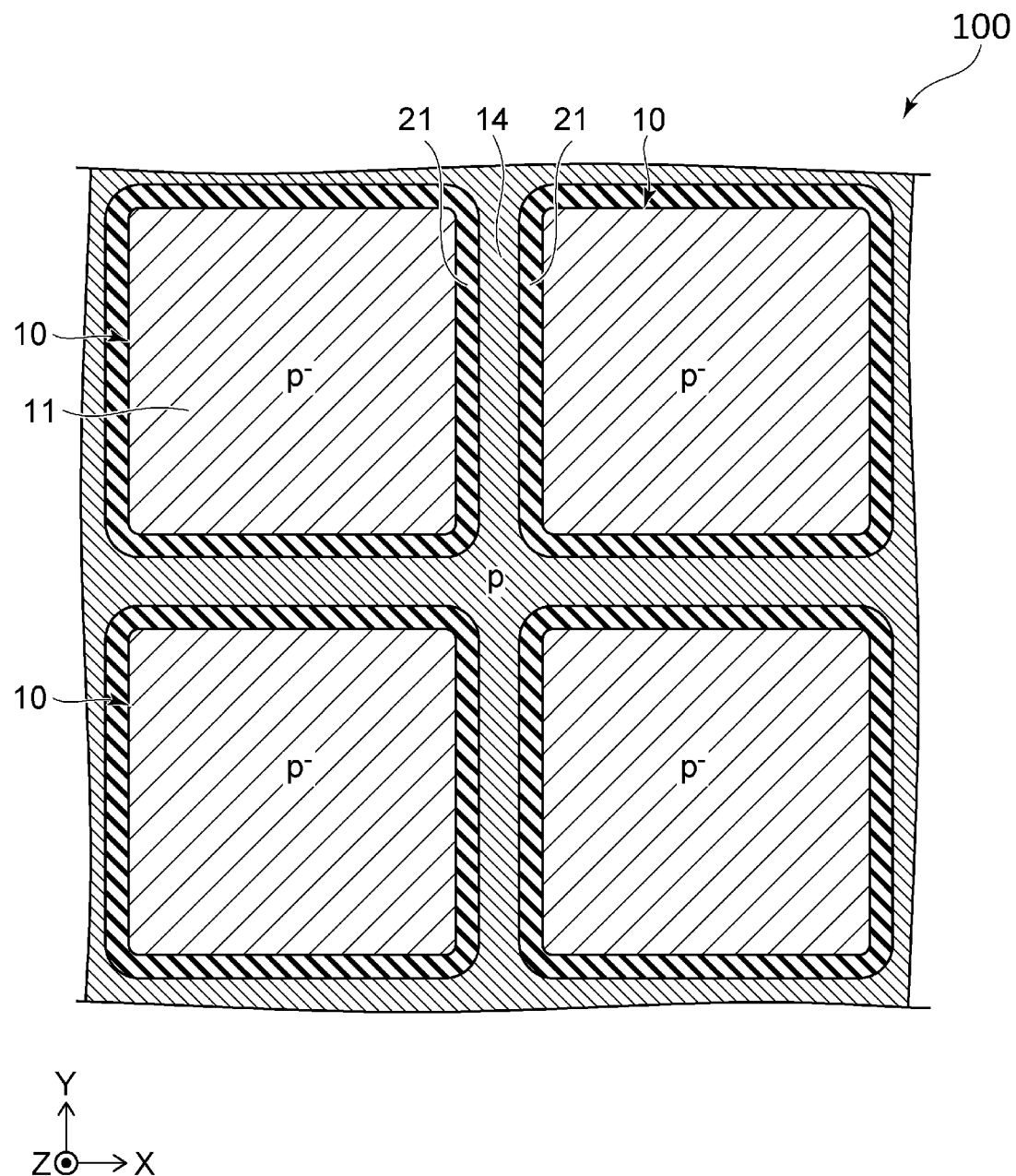
FIG. 3 is a cross-sectional view taken along line B1-B2 of FIG. 2.

FIG. 3 is a cross-sectional view taken along line B1-B2 of FIG. 2.

The first insulating portions 21 appear separated from each other rather than connected to one another at this position. As illustrated in FIG. 3, the p-type semiconductor region 14 is provided between the first insulating portions 21 adjacent to each other in the X direction or the Y direction. Similarly to the p-type semiconductor region 14, the p⁻-type semiconductor region 15 and the semiconductor region 16 are also provided between the first insulating portions 21 adjacent to each other.

The quenching portion 30 is provided on the element portion 10 and is electrically connected to the n⁺-type semiconductor region 13. As illustrated in FIGS. 1 and 2, it is preferable that the quenching portion 30 is provided on the second insulating portion 22. By this arrangement, it is possible to prevent the light traveling toward the element portion 10 from being blocked by a quenching portion 30.

For example, as illustrated in FIG. 1, the n⁺-type semiconductor region 13 is electrically connected to the wiring 35 via a contact plug 30a, a wiring 30b, a contact plug 30c, a quenching portion 30, and a contact plug 30d. The wiring 35 is electrically connected to the plurality of n⁺-type semiconductor regions 13.

The insulating layer 40 is provided on the element portion 10, the first insulating portion 21, and the second insulating portion 22. The above-mentioned contact plugs (30a, 30c, 30d), wirings (35, 30b), and quenching portions 30 are provided in the insulating layer 40. The insulating layer 40 may include a plurality of insulating films stacked in the Z direction.

The operation of the semiconductor device 100 will be described.

When light is incident on an element portion 10, electric charges are generated in the element portion 10. For example, a reverse voltage exceeding a breakdown voltage is applied between the p⁺-type semiconductor region 12 and the n⁺-type semiconductor region 13. The element portion 10 operates in the Geiger mode. Avalanche breakdown occurs due to the electric charges generated in the element portion 10, and thus, a large amount of electric charges is generated. The electric charges flow to the wiring 35 via the n⁺-type semiconductor region 13 and the quenching portion 30 and are extracted to the outside of the semiconductor device 100.

The electrical resistance of the quenching portion 30 is greater than the electrical resistance of each of the contact plugs 30a, 30c, and 30d and the wiring 30b. The electrical resistance of the quenching portion 30 is preferably greater than 10 kΩ but less than 10 MΩ. The quenching portion 30 prevents the continuation of the avalanche breakdown when light is incident on the element portion 10 and avalanche breakdown occurs. When avalanche breakdown occurs and electrons flow into the n⁺-type semiconductor region 13 and the quenching portion 30, the potential of the n⁺-type semiconductor region 13 is decreased by blocking the electrons with the quenching portion 30. Due to the decrease in the potential of the n⁺-type semiconductor region 13, the potential difference between the p⁺-type semiconductor region 12 and the n⁺-type semiconductor region 13 becomes smaller, and the avalanche breakdown stops. Accordingly, the element portion 10 can again detect the incident light.

As described above, a resistor that causes a large voltage drop may be provided as the quenching portion 30. A quenching portion 30 including a transistor by which an active quenching method is applied may be provided instead of a resistor.

An example of composition of each element will be described. The p⁺-type semiconductor layer 1, the p⁻-type semiconductor region 11, the p⁺-type semiconductor region 12, the n⁺-type semiconductor region 13, the p-type semiconductor region 14, the p⁻-type semiconductor region 15, and the semiconductor region 16 comprise a semiconductor material such as silicon, silicon carbide, gallium arsenide, and gallium nitride. When silicon is used as the semiconductor material, phosphorus, arsenic, or antimony can be used as an n-type impurity (dopant). Boron can be used as a p-type impurity (dopant).

The first insulating portion 21, the second insulating portion 22, and the insulating layer 40 comprise an insulating material (non-conductive material). In order to reduce crosstalk due to secondary photons between the adjacent element portions 10, it is preferable that a refractive index of the insulating material used for the insulating portion 20 is lower than a refractive index of the semiconductor material used for the element portion 10. For example, the first insulating portion 21, the second insulating portion 22, and the insulating layer 40 comprise silicon oxide.

The quenching portion 30 when provided as a resistor comprises polysilicon. An n-type impurity or a p-type impurity may be added to the quenching portion 30. Each contact plug and each wiring comprises a metal material. The metal material can be at least one selected from a group including titanium, tungsten, copper, and aluminum.

Certain advantages of some embodiments will be described.

Figure 4:
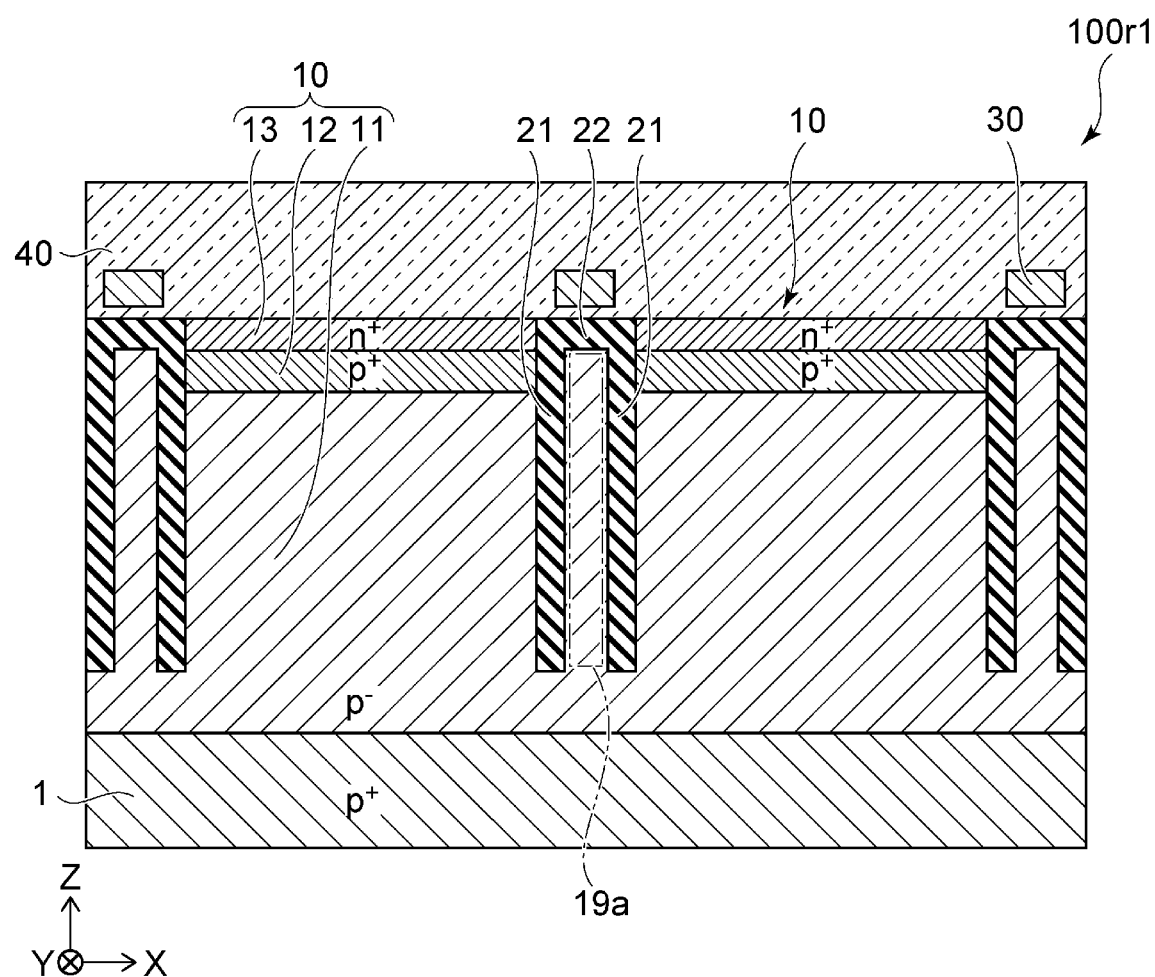
FIG. 4 is a cross-sectional view illustrating a semiconductor device according to a reference example.

FIG. 4 is a cross-sectional view illustrating a semiconductor device according to a reference example.

In a semiconductor device 100r1 according to the reference example illustrated in FIG. 4, the p-type semiconductor region 14 is not provided. A p⁻-type semiconductor region 19a is provided surrounding a first insulating portion 21.

Figure 5A:
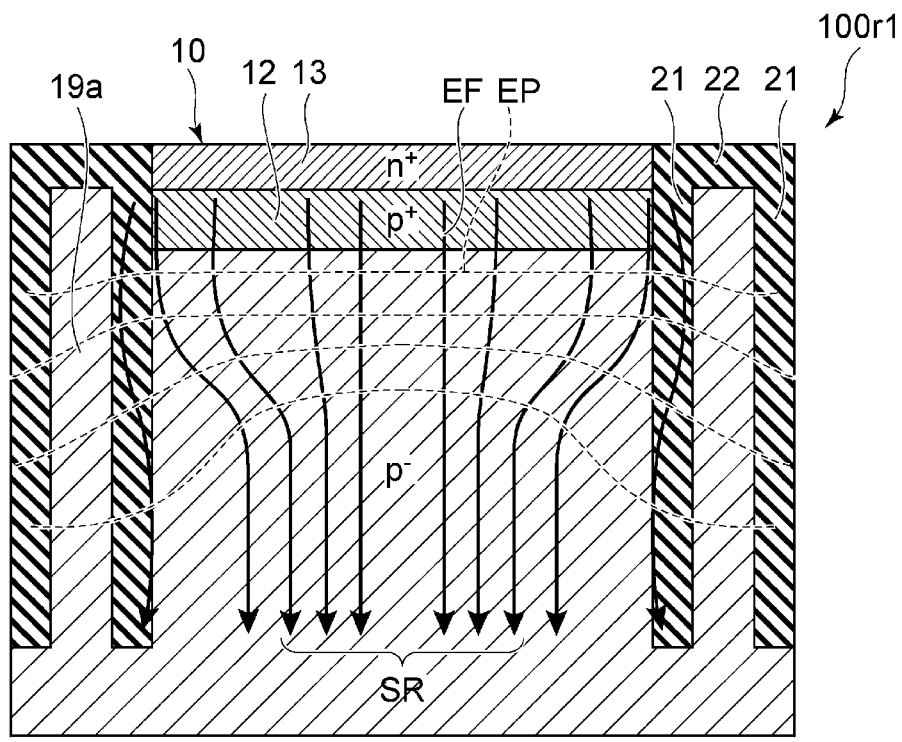
FIG. 5A is a schematic view illustrating certain characteristics of a semiconductor device according to a reference example.
Figure 5B:
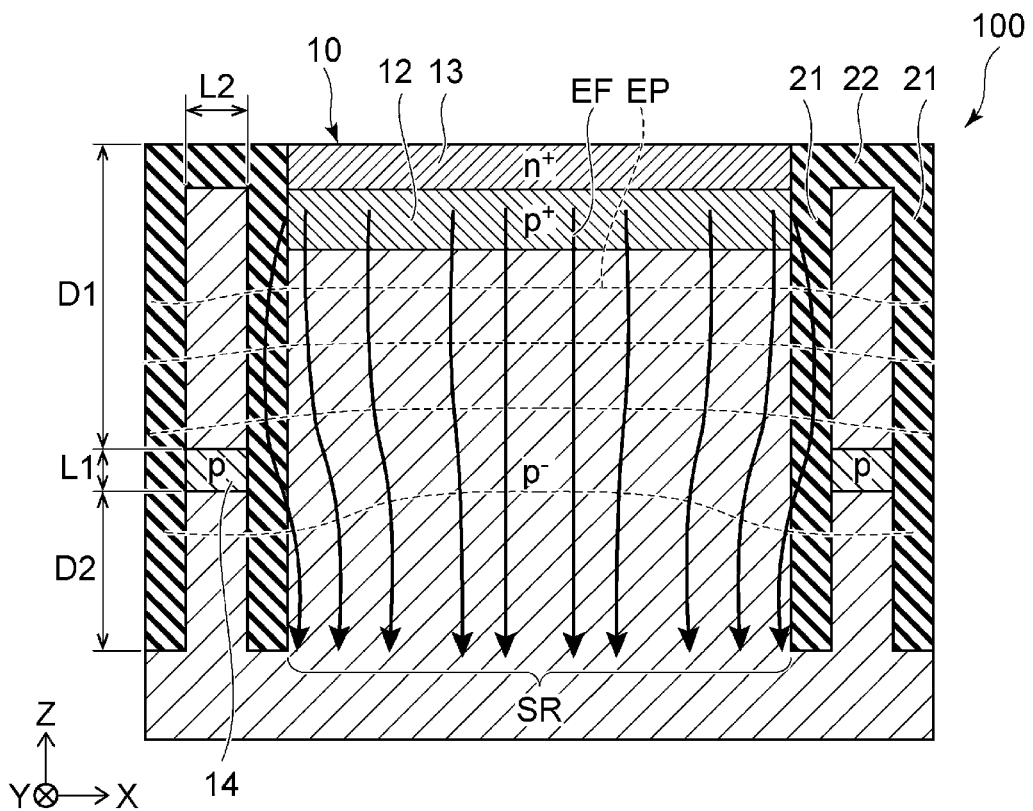
FIG. 5B is a schematic view illustrating certain characteristics of a semiconductor device according to an embodiment.

FIGS. 5A and 5B are schematic views illustrating certain characteristics of a semiconductor device according to the reference example (FIG. 5A) and an embodiment (FIG. 5B) of the present disclosure.

In FIGS. 5A and 5B, solid line arrows indicate the direction of an electric field EF. Broken lines indicate equipotential surfaces EP. The semiconductor devices 100 and 100r1 are provided with the p⁺-type semiconductor region 12 and the n⁺-type semiconductor region 13 having a higher impurity concentration than the p⁻-type semiconductor region 11. In this case, as illustrated in FIG. 5A, below the outer circumference of these pn junction surfaces, the equipotential surface EP swells downward in a convex shape. The direction of the electric field EF is curved toward the center of the element portion 10.

FIGS. 5A and 5B both illustrate an example of a width of a sensitive region SR. The electric charges existing in the sensitive region SR move along the electric field EF to allow the avalanche breakdown to occur. As illustrated in FIG. 5A, when the electric field EF is curved toward the center of the element portion 10, the width of the sensitive region SR becomes smaller than the full width of the element portion 10.

With respect to this problem, in the semiconductor device 100 according to the present embodiment, the p-type semiconductor region 14 is provided surrounding the first insulating portion 21. When the p-type semiconductor region 14 is provided, as illustrated in FIG. 5B, the expansion of the depletion layer around the outer periphery of the first insulating portion 21 is prevented. Accordingly, the curvature of the electric field EF toward the center of the element portion 10 can be reduced or prevented. As a result, the sensitive region SR can be wider in comparison with the semiconductor device 100r1. The light detection efficiency of the semiconductor device 100 is thus improved.

Figure 6:
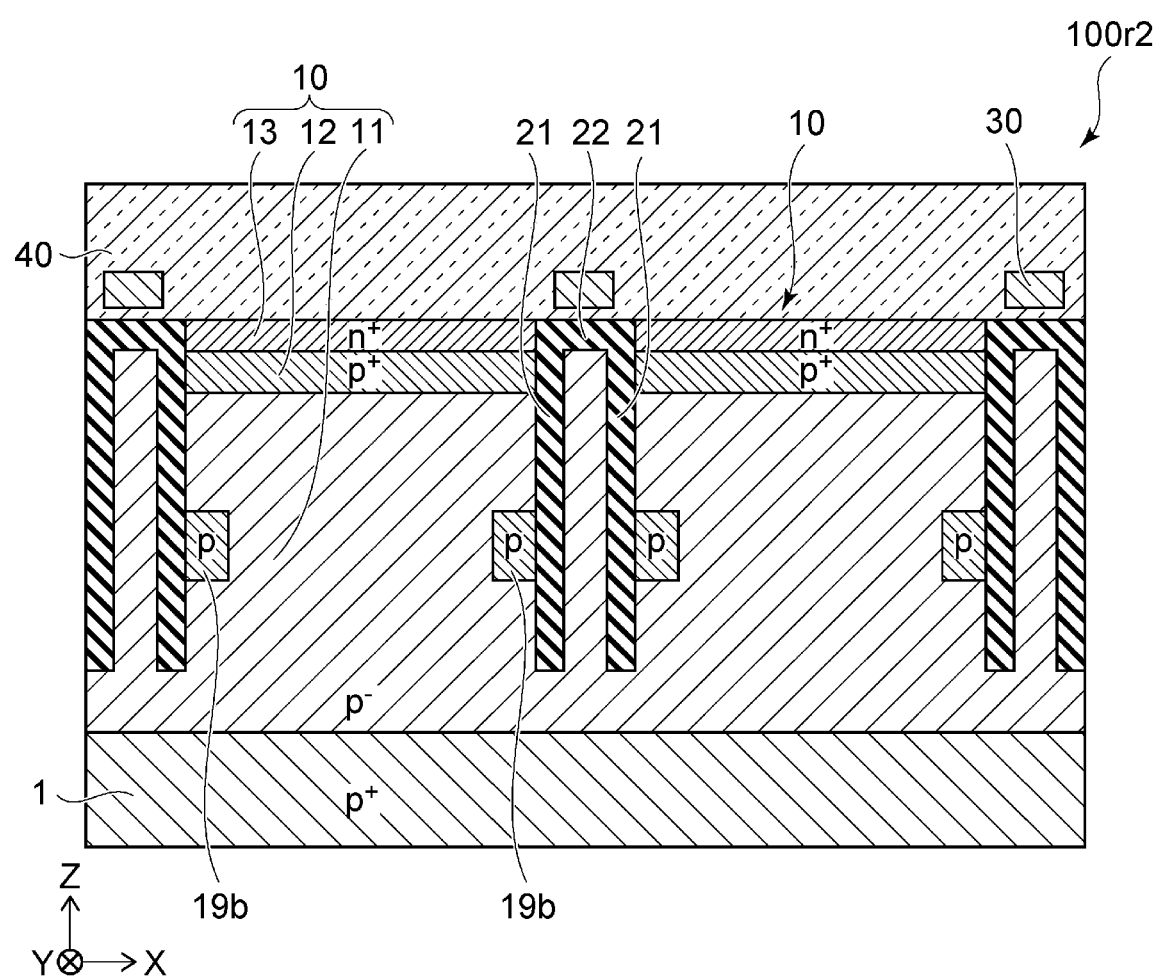
FIG. 6 is a cross-sectional view illustrating another semiconductor device according to a reference example.

FIG. 6 is a cross-sectional view illustrating another semiconductor device according to a reference example.

In order to widen the sensitive region SR, it can be considered as a potential solution that the p-type semiconductor region 19b be provided in the element portion 10 as in a semiconductor device 100r2 illustrated in FIG. 6. However, in this case, the expansion of the depletion layer is prevented by the p-type semiconductor region 19b.

Accordingly, a junction capacitance in the element portion 10 is increased. As the junction capacitance is increased, secondary photons are more likely to be generated when the avalanche breakdown occurs. There is a possibility that the increase in the number of secondary photons can increase crosstalk noise between adjacent element portions 10.

In the semiconductor device 100 according to the present embodiment, the first insulating portion 21 is provided between the element portion 10 and the p-type semiconductor region 14. Accordingly, an increase in junction capacitance due to the provision of the p-type semiconductor region 14 can be prevented. As a result, the increase of the secondary photons can be prevented, and thus, the increase of crosstalk noise can be prevented. Thus, the light detection efficiency can be improved while preventing an increase in crosstalk.

For example, as illustrated in FIG. 5B, the length L1 of the p-type semiconductor region 14 in the Z direction is smaller than the length L2 of the p-type semiconductor region 14 in the X direction.

It is preferable that the distance D2 in the Z direction between the p-type semiconductor region 14 and the lower end of the first insulating portion 21 is shorter than the distance D1 in the Z direction between the p-type semiconductor region 14 and the upper surface of the element portion 10.

As illustrated in FIG. 5A, the electric field EF is curved toward the center of the element portion 10 at a deep position. Since the distance D2 is shorter than the distance D1, the expansion of the depletion layer on the outer periphery of the first insulating portion 21 can be prevented at a deeper position. Accordingly, the curvature of the electric field EF toward the center of the element portion 10 can be more effectively prevented. As a result, the light detection efficiency of the semiconductor device 100 can be further improved.

The boundary between the p-type semiconductor region 14 and the p⁻-type semiconductor region 15 can be specified by the following method. A maximum p-type impurity concentration (first concentration) in the p-type semiconductor region 14 is measured. A p-type impurity concentration (second concentration) of the p⁻-type semiconductor region 15 at a position separated from the p-type semiconductor region 14 is measured. A position having the p-type impurity concentration that is halfway between the first concentration and the second concentration is identified between the p-type semiconductor region 14 and the p⁻-type semiconductor region 15. This position corresponds to the boundary between the p-type semiconductor region 14 and the p⁻-type semiconductor region 15.

The boundary between the p-type semiconductor region 14 and the semiconductor region 16 can be specified by the following method. When the semiconductor region 16 is of an n-type, the position of the pn junction surface between the p-type semiconductor region 14 and the semiconductor region 16 corresponds to the boundary between the p-type semiconductor region 14 and the semiconductor region 16. When the semiconductor region 16 is of a p-type, the maximum p-type impurity concentration (first concentration) in the p-type semiconductor region 14 is measured. The p-type impurity concentration (second concentration) of the semiconductor region 16 at the position separated from the p-type semiconductor region 14 is measured. The position having a p-type impurity concentration that is halfway between the first concentration and the second concentration is identified between the p-type semiconductor region 14 and the semiconductor region 16. The position corresponds to the boundary between the p-type semiconductor region 14 and the semiconductor region 16.

FIGS. 7 to 10 are cross-sectional views illustrating semiconductor devices according to certain modifications of the present embodiment.

Figure 7:
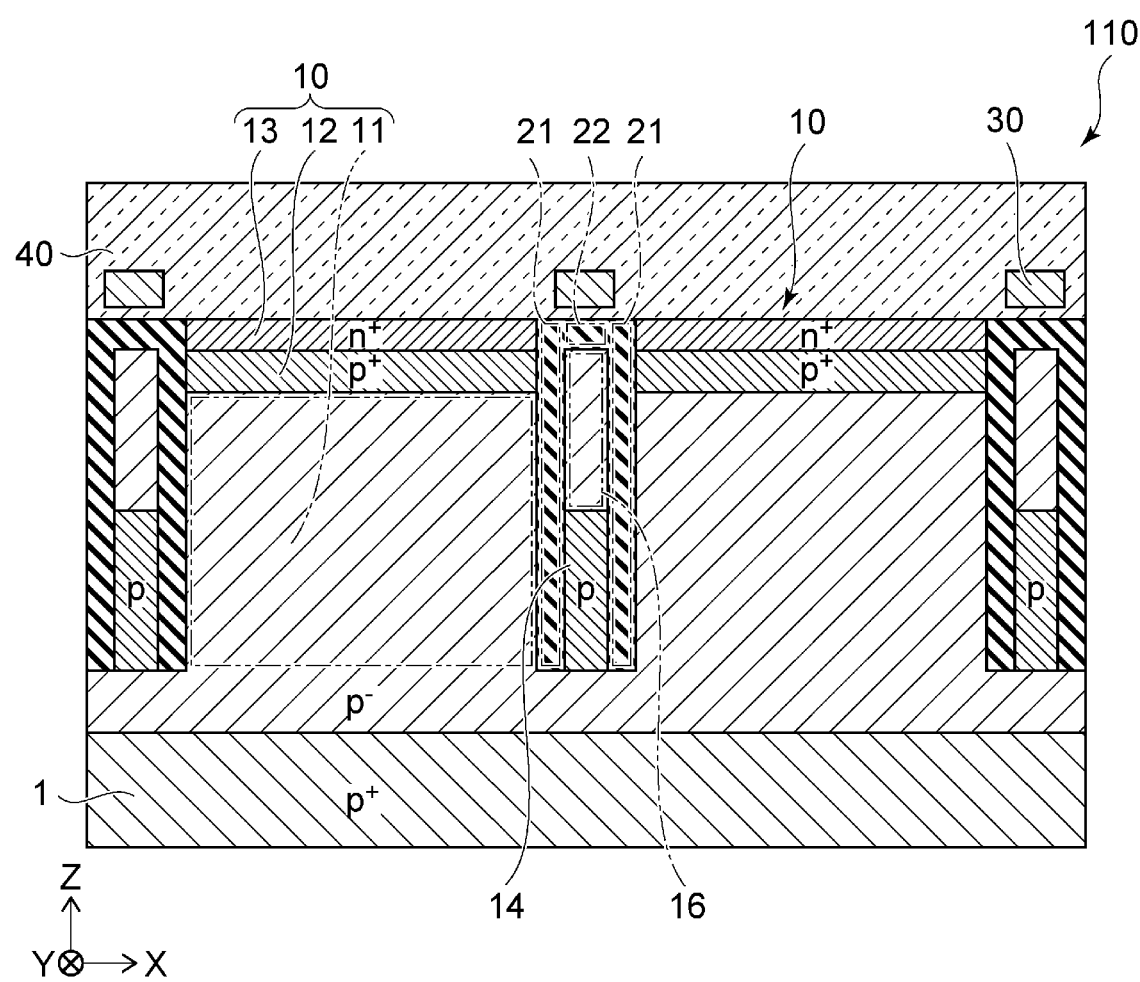
FIGS. 7-10 are each a cross-sectional view illustrating semiconductor devices according to certain modifications of an embodiment.

A semiconductor device 110 illustrated in FIG. 7 is different from the semiconductor device 100 in that the p⁻-type semiconductor region 15 is not provided. For example, the lower end of the p-type semiconductor region 14 is aligned with the lower end of the first insulating portion 21 in the X direction or the Y direction.

Figure 8:
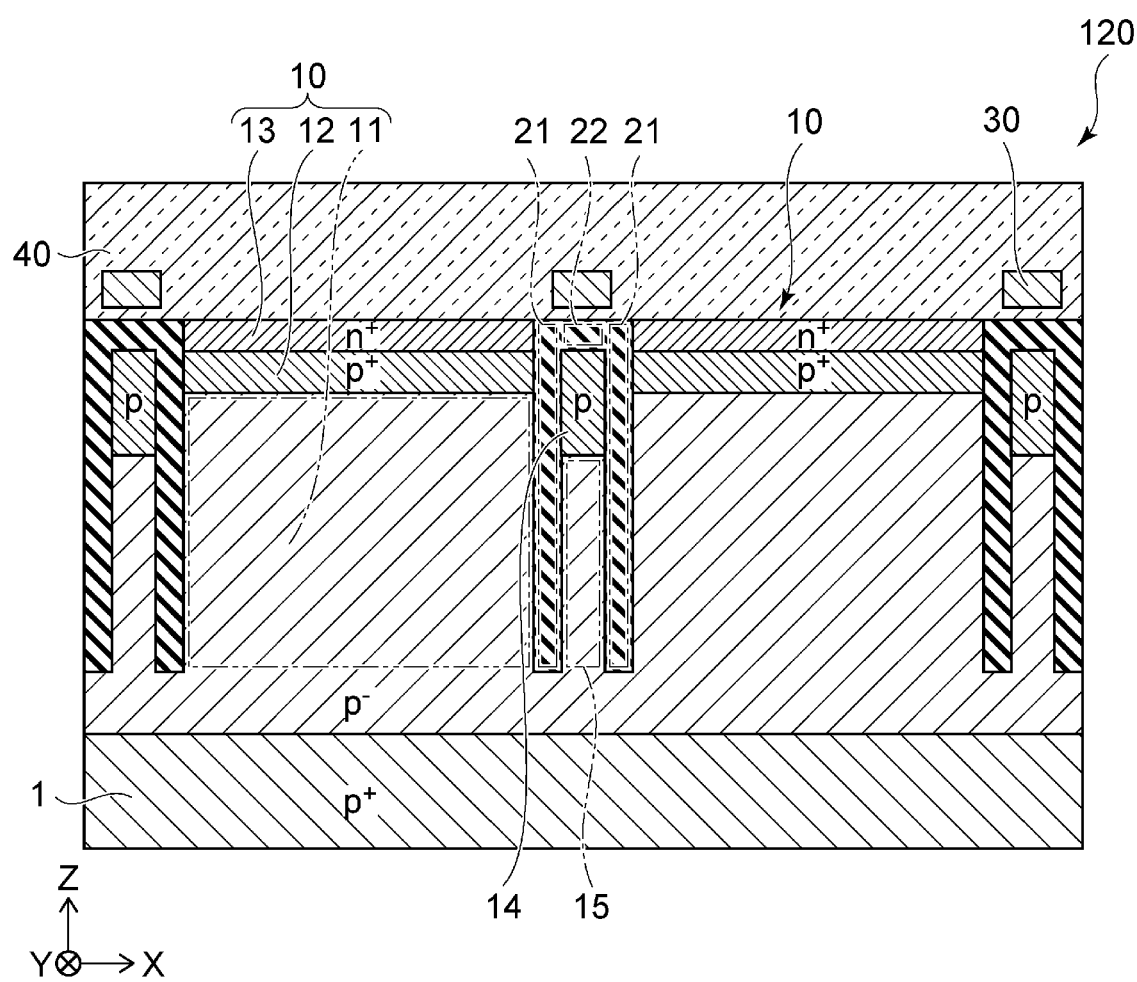

A semiconductor device 120 illustrated in FIG. 8 is different from the semiconductor device 100 in that the semiconductor region 16 is not provided. For example, the p-type semiconductor region 14 is in contact with the second insulating portion 22. A portion of the p-type semiconductor region 14 is located surrounding the p⁺-type semiconductor region 12 along an X-Y plane.

Figure 9:
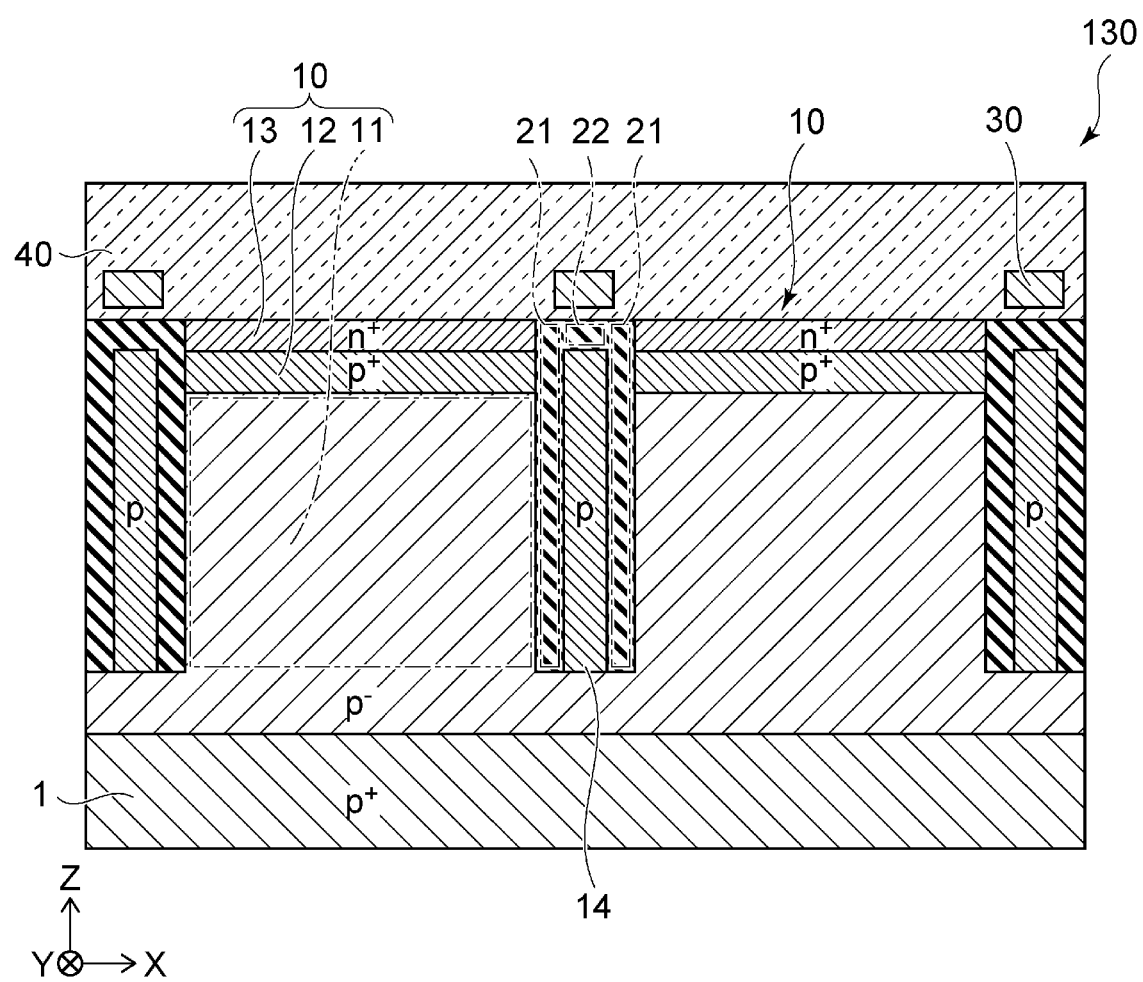

In the semiconductor device 130 illustrated in FIG. 9, the p⁻-type semiconductor region 15 and the semiconductor region 16 are not provided. The space between the first insulating portions 21 is filled entirely with the p-type semiconductor region 14.

Similar to the semiconductor device 100, the semiconductor devices 110, 120, 130, can have improved light detection efficiency while preventing an increase in crosstalk.

In addition, according to the semiconductor device 110 illustrated in FIG. 7, the expansion of the depletion layer over a wider range can be prevented at a deeper position in comparison with the semiconductor device 100.

According to the semiconductor device 100, since the length of the p-type semiconductor region 14 in the Z direction is smaller than that of the semiconductor devices 110 and 130, the p-type semiconductor region 14 can be easily formed.

Figure 10:
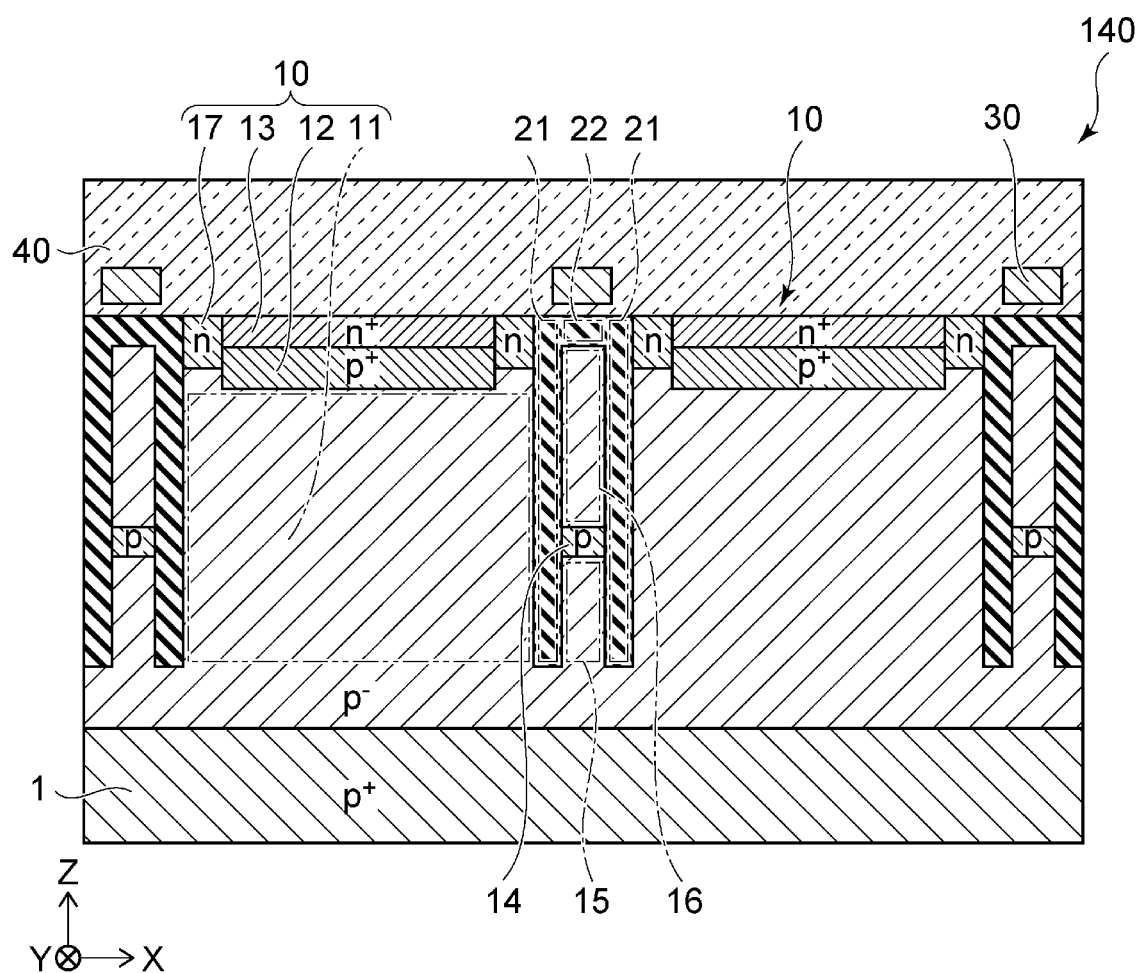

In the semiconductor device 140 illustrated in FIG. 10, the p⁺-type semiconductor region 12 and the n⁺-type semiconductor region 13 are separated from the first insulating portion 21. In the semiconductor device 140, an n-type semiconductor region 17 is provided between the p⁺-type semiconductor region 12 and the first insulating portion 21 and between the n⁺-type semiconductor region 13 and the first insulating portion 21.

The n-type semiconductor region 17 is located surrounding the p⁺-type semiconductor region 12 and the n⁺-type semiconductor region 13 in an X-Y plane. For example, the lower end of the n-type semiconductor region 17 is located higher than the lower end of the p⁺-type semiconductor region 12. The n-type impurity concentration in the n-type semiconductor region 17 is lower than the n-type impurity concentration in the n⁺-type semiconductor region 13.

When the n-type semiconductor region 17 is provided, an electric field strength in the lower portion of the outer circumference of the n⁺-type semiconductor region 13 can be decreased. Therefore, it is possible to prevent a local increase in the electric field strength in the element portion 10. Accordingly, for example, edge breakdown can be prevented from occurring, and the operation of the semiconductor device 140 can be further stabilized.

The modifications described above can be combined as appropriate with one other in some examples. For example, the n-type semiconductor region 17 may be provided in any of the semiconductor devices 110 to 130.

The relative level of the impurity concentration between the semiconductor regions in each of the embodiments described above can be detected by using, for example, a scanning capacitance microscope (SCM). The carrier concentration in each semiconductor region can be regarded as equal to the impurity concentration activated in the semiconductor region. Therefore, the relative level of the carrier concentration between the semiconductor regions can also be checked by using the SCM. In addition, the impurity concentration in each semiconductor region can be measured by, for example, secondary ion mass spectrometry (SIMS).

While certain embodiments have been described, these embodiments have been presented by way of example only, and are not intended to limit the scope of the disclosure. Indeed, the novel embodiments described herein may be embodied in a variety of other forms; furthermore, various omissions, substitutions and changes in the form of the embodiments described herein may be made without departing from the spirit of the disclosure. The accompanying claims and their equivalents are intended to cover such forms or modifications as would fall within the scope and spirit of the disclosure.

In addition, each of the embodiments described above can be implemented in combination with the other embodiments.

What is claimed is:

1. A semiconductor device, comprising:
a plurality of element regions, each element region including:
a first semiconductor region of a first conductivity type;
a second semiconductor region of the first conductivity type on the first semiconductor region and having a higher impurity concentration than that of the first semiconductor region; and
a third semiconductor region of a second conductivity type on the second semiconductor region, the second semiconductor region being between the first and third semiconductor regions in a first direction;
a first insulating portion surrounding each element region in a first plane intersecting the first direction;
a fourth semiconductor region of the first conductivity type surrounding each element region and the first insulating portion in the first plane, the fourth semiconductor region having a higher impurity concentration than that of the first semiconductor region; and
a quenching structure that is above a part of the fourth semiconductor region in the first direction and electrically connected to the third semiconductor region, the part of the fourth semiconductor region being between a pair of adjacent element regions in a second direction parallel to the first plane.

2. The semiconductor device according to claim 1, further comprising:
a fifth semiconductor region of the first conductivity type adjacent to the first insulating portion in the second direction and below the fourth semiconductor region in the first direction, wherein
the fourth semiconductor region directly contacts the fifth semiconductor region, and
the impurity concentration in the fourth semiconductor region is higher than the impurity concentration in the fifth semiconductor region.

3. The semiconductor device according to claim 2, wherein the first insulating portion is between the first semiconductor region and the fourth semiconductor region in the second direction, and the second semiconductor region and the fourth semiconductor region are not at the same level along the first direction.

4. The semiconductor device according claim 2, further comprising:
a sixth semiconductor region above the fourth semiconductor region in the first direction and directly contacting the fourth semiconductor region, wherein
the impurity concentration of the sixth semiconductor region is lower than the impurity concentration of the fourth semiconductor region.

5. The semiconductor device according to claim 1, wherein the length of the fourth semiconductor region in the first direction is less than the width of the fourth semiconductor region in the second direction.

6. The semiconductor device according to claim 1, further comprising:
a second insulating portion above the fourth semiconductor region in the first direction and between adjacent element regions in the second direction, wherein
the second insulating portion is between the quenching structure and the fourth semiconductor region in the first direction.

7. The semiconductor device according to claim 1, wherein the plurality of the element regions are arrayed along the second direction and a third direction parallel to the first plane and perpendicular to the second direction.

8. The semiconductor device according claim 1, wherein the element regions operate as light receiving elements in a Geiger mode.

9. The semiconductor device according to claim 1, wherein the first insulating portion is between the first semiconductor region and the fourth semiconductor region in the second direction, and the second semiconductor region and the fourth semiconductor region are not at the same level along the first direction.

10. The semiconductor device according claim 1, further comprising:
a sixth semiconductor region above the fourth semiconductor region in the first direction and directly contacting the fourth semiconductor region, wherein
the impurity concentration of the sixth semiconductor region is lower than the impurity concentration of the fourth semiconductor region.

11. The semiconductor device according to claim 1, wherein the quenching structure is a resistive element connecting the third semiconductor region to a metal wiring.

12. The semiconductor device according to claim 11, wherein the quenching structure is polysilicon.

13. The semiconductor device according to claim 1, wherein the fourth semiconductor region and the first insulating portion extend to substantially the same distance in the first direction.

14. The semiconductor device according to claim 1, wherein
the first insulating portion is between the fourth semiconductor region and the second semiconductor region in the second direction, and
the fourth semiconductor region extends in the first direction for a greater distance than the second semiconductor region.

15. The semiconductor device according to claim 14, wherein the fourth semiconductor region extends in the first direction to the same distance as the first insulating portion.

16. The semiconductor device according to claim 1, further comprising:
a fifth semiconductor region of the second conductivity type between the first insulating portion and the third semiconductor region in the second direction, wherein
the fifth semiconductor region has an impurity concentration less than the third semiconductor region.

17. A photon detecting device, comprising:
an array of element regions spaced from each other within a plane, each element region including:
a first semiconductor region of a first conductivity type;
a second semiconductor region of the first conductivity type on the first semiconductor region and having a higher impurity concentration than that of the first semiconductor region; and
a third semiconductor region of a second conductivity type on the second semiconductor region, the second semiconductor region being between the first and third semiconductor regions in a first direction orthogonal to the plane, wherein
each element region is surrounded within the plane by a first insulating portion that extends from an upper surface of the element region to a bottom of the element region,
each element region is surrounded within the plane by a fourth semiconductor region of the first conductivity type,
the fourth semiconductor region is between each adjacent pair of element regions,
the first insulating portion is between each element region and the fourth semiconductor region, and
the fourth semiconductor region has a higher impurity concentration than that of the first semiconductor region.

18. The photon detecting device according to claim 17, further comprising:
a quenching structure between an adjacent pair of element regions and above a part of the fourth semiconductor region in the first direction that is between the adjacent pair of element regions, the quenching structure being electrically connected to a third semiconductor region of one of the pair of element regions.

19. The photon detecting device according to claim 17, wherein the length of the fourth semiconductor region in the first direction is less than the width of the fourth semiconductor region in a second direction parallel to the plane.

20. The photon detecting device according to claim 19, wherein the first insulating portion is between the fourth semiconductor region and the first semiconductor region of an element region in the second direction.

* * * * *